United States Patent
Liu et al.

(10) Patent No.: US 10,872,858 B2
(45) Date of Patent: Dec. 22, 2020

(54) SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou (CN)

(72) Inventors: Hong-Ru Liu, Chiayi County (TW); Kuei-Hsuan Yu, New Taipei (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/027,283

(22) Filed: Jul. 4, 2018

(65) Prior Publication Data

US 2019/0067183 A1  Feb. 28, 2019

(30) Foreign Application Priority Data

Aug. 30, 2017  (CN) .......................... 2017 1 0761592

(51) Int. Cl.
*H01L 27/108* (2006.01)
*H01L 23/528* (2006.01)
*H01L 27/02* (2006.01)

(52) U.S. Cl.
CPC ........ *H01L 23/528* (2013.01); *H01L 27/0207* (2013.01); *H01L 27/10805* (2013.01)

(58) Field of Classification Search
CPC .............. H01L 23/528; H01L 27/0207; H01L 27/10805; H01L 27/10882; H01L 27/115; H01L 27/11568; H01L 27/10855
See application file for complete search history.

(56) References Cited

U.S. PATENT DOCUMENTS

| | | | |
|---|---|---|---|
| 5,959,321 A * | 9/1999 | Lee | H01L 27/10844 257/296 |
| 9,490,256 B2 | 11/2016 | Kim | |
| 9,576,895 B2 | 2/2017 | Lee | |
| 2004/0021159 A1 | 2/2004 | Matsuoka | |
| 2004/0156255 A1 | 8/2004 | Tsukikawa | |
| 2005/0006710 A1 * | 1/2005 | Riedel | G11C 16/0491 257/390 |
| 2006/0120129 A1 | 6/2006 | Schloesser | |

(Continued)

FOREIGN PATENT DOCUMENTS

| CN | 1231514 A | 10/1999 |
|---|---|---|
| CN | 1815718 A | 8/2006 |

(Continued)

*Primary Examiner* — Brook Kebede

(74) *Attorney, Agent, or Firm* — Winston Hsu

(57) ABSTRACT

A semiconductor memory device includes a semiconductor substrate, a plurality of word lines, and a plurality of bit lines. The semiconductor substrate includes a plurality of active areas. The word lines are disposed parallel to one another, and each of the word lines is elongated in a first direction. Each of the word lines overlaps at least one of the active areas. The bit lines are disposed parallel to one another, and each of the bit lines is elongated in a second direction. Each of the bit lines overlaps at least one of the active areas. The bit lines cross the word lines. An included angle between the first direction and the second direction is larger than 0 degree and smaller than 90 degrees.

9 Claims, 8 Drawing Sheets

(56) References Cited

U.S. PATENT DOCUMENTS

| | | | |
|---|---|---|---|
| 2006/0205141 A1* | 9/2006 | Park | H01L 27/10855 |
| | | | 438/239 |
| 2008/0035956 A1* | 2/2008 | Manning | G11C 5/063 |
| | | | 257/202 |
| 2010/0006906 A1 | 1/2010 | Rhee | |
| 2016/0308000 A1 | 10/2016 | Kim | |

FOREIGN PATENT DOCUMENTS

| | | | |
|---|---|---|---|
| CN | 101297399 A | 10/2008 | |
| CN | 103390621 A | 11/2013 | |
| CN | 106653754 A | 5/2017 | |
| EP | 0 949 681 A1 | 10/1999 | |

\* cited by examiner

SEMICONDUCTOR MEMORY DEVICE

BACKGROUND OF THE INVENTION

1. Field of the Invention

The present invention relates to a semiconductor memory device, and more particularly, to a semiconductor memory device including word lines and bit lines crossing one another.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series.

The numbers of the memory cells in the array have to be increased unceasingly for product needs. Therefore, how to increase the memory cell density within the limited area is always an important issue for the related field.

SUMMARY OF THE INVENTION

A semiconductor memory device is provided in the present invention. Word lines or bit lines are disposed obliquely for making an included angle between a first direction and a second direction larger than 0 degree and smaller than 90 degrees, wherein the word lines are elongated in the first direction, and the bit lines are elongated in the second direction. The size of the memory cell defined by the word lines and the bit lines crossing one another may be reduced by the design of the present invention, and the memory cell density may be enhanced accordingly.

According to an embodiment of the present invention, a semiconductor memory device is provided. The semiconductor memory device includes a semiconductor substrate, a plurality of word lines, and a plurality of bit lines. The semiconductor substrate includes a plurality of active areas. The word lines are disposed parallel to one another, and each of the word lines is elongated in a first direction. Each of the word lines overlaps at least one of the active areas. The bit lines are disposed parallel to one another, and each of the bit lines is elongated in a second direction. Each of the bit lines overlaps at least one of the active areas, and the bit lines cross the word lines. An included angle between the first direction and the second direction is larger than 0 degree and smaller than 90 degrees.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
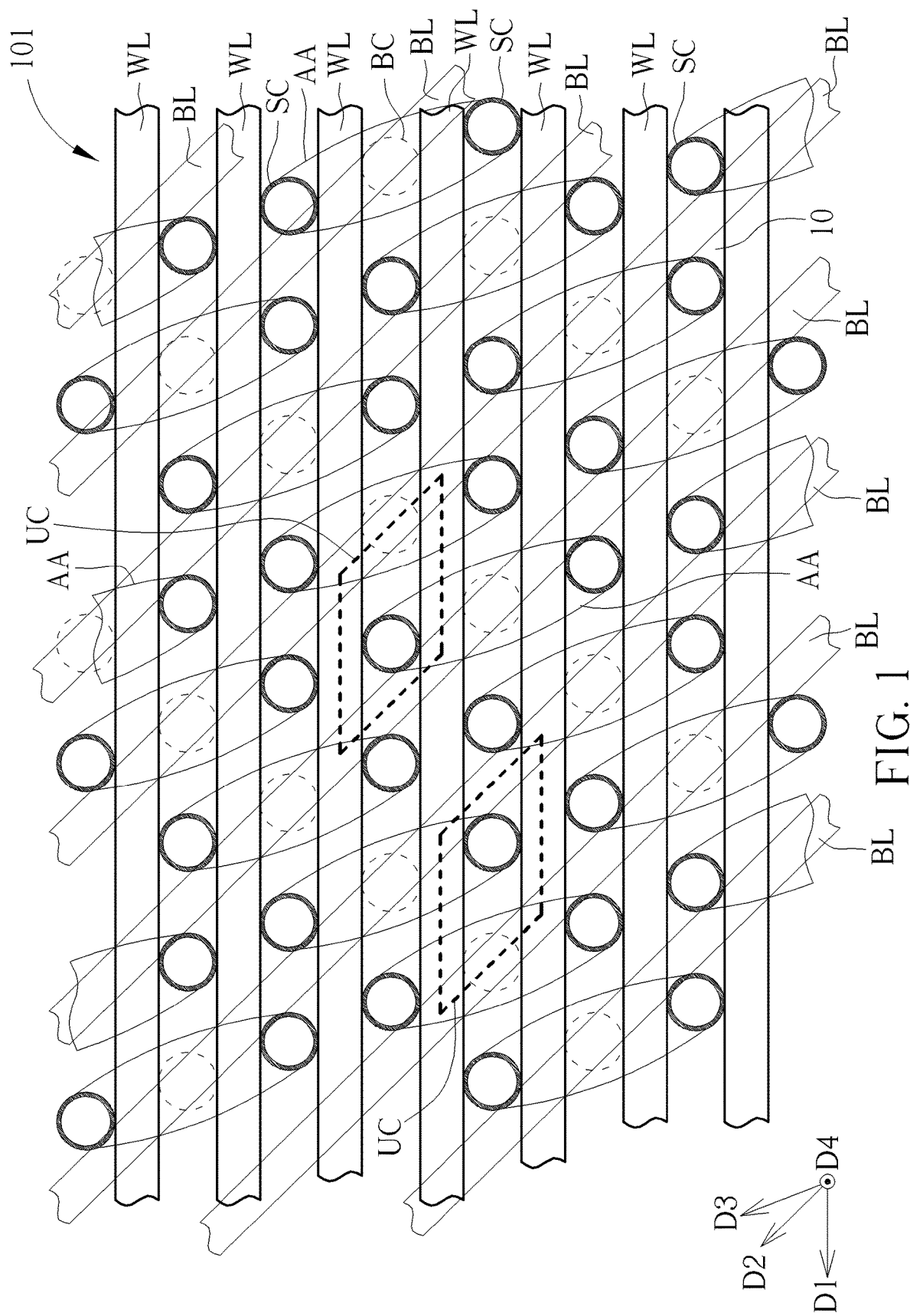
FIG. 1 is a schematic drawing illustrating a semiconductor memory device according to a first embodiment of the present invention.
Figure 2:
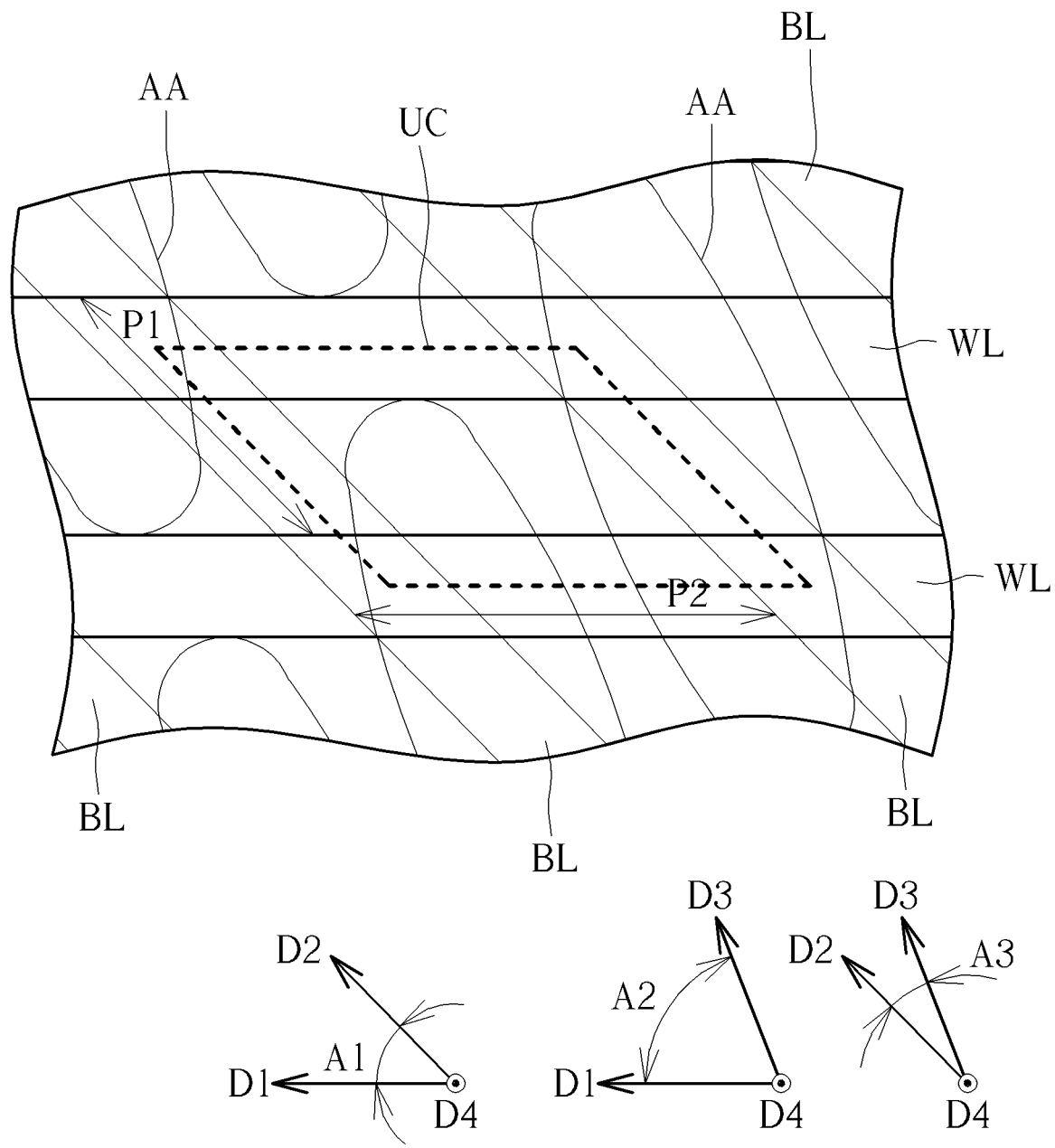
FIG. 2 is an enlarged view of a memory cell in the semiconductor memory device according to the first embodiment of the present invention.

Please refer to FIG. 1 and FIG. 2. FIG. 1 is a schematic drawing illustrating a semiconductor memory device according to a first embodiment of the present invention, and FIG. 2 is an enlarged view of a memory cell in the semiconductor memory device of this embodiment. As shown in FIG. 1 and FIG. 2, a semiconductor memory device 101 is provided in this embodiment. The semiconductor memory device 101 includes a semiconductor substrate 10, a plurality of word lines WL, and a plurality of bit lines BL. The semiconductor substrate 10 may include a silicon substrate, an epitaxial silicon substrate, a silicon germanium substrate, a silicon carbide substrate, or a silicon-on-insulator (SOI) substrate, but not limited thereto. The semiconductor substrate 10 includes a plurality of active areas AA. In some embodiments, a shallow trench isolation (not shown) may be formed in the semiconductor substrate 10, and the shallow trench isolation may be used to define a plurality of the active areas AA in the semiconductor substrate 10, but not limited thereto. The word lines WL are disposed parallel to one another, and each of the word lines WL is elongated in a first direction D1. Each of the word lines WL overlaps at least one of the active areas AA. In some embodiments, each of the word lines WL may overlap more than one of the active areas AA in a thickness direction of the semiconductor substrate 10 (such as a fourth direction D4 shown in FIG. 1), each of the active areas AA may be disposed corresponding to two of the word lines WL, and each of the active areas AA may overlap two of the word lines WL in the fourth direction D4, but not limited thereto. Additionally, in some embodiments, the word lines WL may be buried word lines, but not limited thereto. The word lines WL may be formed and buried in the semiconductor substrate 10. A word line dielectric layer (not shown) may be formed between each of the word lines WL and the semiconductor substrate 10, and a word line cap layer (not shown) may be formed on each of the word lines WL and cover the word lines WL, but not limited thereto. The word line dielectric layers, the word lines WL, and the word line cap layers described above may be formed by forming a plurality of trenches in the semiconductor substrate 10, and the word line dielectric layers, the word lines WL, and the word line cap layers may be sequentially formed in the trenches, but not limited thereto. In some embodiments, other types of word line structures may also be applied. Additionally, the word lines WL may include aluminum (Al), tungsten (W), copper (Cu), titanium aluminide (TiAl), or other suitable conductive materials.

The bit lines BL are disposed parallel to one another, and each of the bit lines BL is elongated in a second direction D2. Each of the bit lines BL overlaps at least one of the active areas AA. In some embodiments, each of the bit lines BL may overlap more than one of the active areas AA in the fourth direction D4, each of the active areas AA may be disposed corresponding to one of the bit lines BL, and each of the active areas AA may overlap one of the bit lines BL in the fourth direction D4, but not limited thereto. The bit lines BL cross the word lines WL, and an included angle between the first direction D1 and the second direction D2 (such as a first included angle A1 shown in FIG. 2) may be larger than 0 degree and smaller than 90 degrees. In other words, the first direction D1 is not parallel to the second direction D2, and the first direction D1 is not perpendicular to the second direction D2. Additionally, the bit lines BL may include multiple material layers (such as a conductive layer, a barrier layer, and an insulation cap layer) stacked in the fourth direction D4, but not limited thereto.

In some embodiments, the semiconductor memory device 101 may further include a plurality of bit line contact structures BC and a plurality of storage node contact structures SC. Each of the bit line contact structures BC may be disposed between the corresponding bit line BL and the active area AA overlapped by the bit line BL in the fourth direction D4, and the bit line BL may be electrically connected with the corresponding active area AA by the bit line contact structure BC. In some embodiments, the bit line contact structures BC may be formed in recesses on the semiconductor substrate 10, and the bit line contact structures BC and the bit lines BL may be formed concurrently, but not limited thereto. An end of the storage node contact structure SC may be disposed corresponding to and electrically connected to one of the active areas AA, and another end of the storage node contact structure SC may be connected with a capacitor structure. In some embodiments, each of the active areas AA may be disposed corresponding to two of the storage node contact structures SC, but not limited thereto. The storage node contact structures SC may be formed by forming an isolation structure (not shown) having a plurality of openings on the semiconductor substrate 10 and filling the openings of the isolation structure with a conductive material, but not limited thereto. The storage node contact structures SC may include silicon, such as amorphous silicon or polysilicon, other conductive materials containing silicon, or other conductive materials without silicon.

The shape of the memory cell UC defined by the word lines WL and the bit lines BL crossing one another may be a parallelogram and is not a rectangle because the included angle between the first direction D1 (the elongation direction of the word line WL) and the second direction D2 (the elongation direction of the bit line BL) is larger than 0 degree and smaller than 90 degrees. In some embodiments, the word lines WL may have a first pitch P1 in the elongation direction of each of the bit lines BL (i.e. the second direction D2), and the bit lines BL may have a second pitch P2 in the elongation direction of each of the word lines WL (i.e. the first direction D1). In other words, the word lines WL may be arranged in the second direction D2 by the first pitch P1, and the bit lines BL may be arranged in the first direction D1 by the second pitch P2. The second pitch P2 may be larger than the first pitch P1 preferably for cooperating with the allocation design of the storage node contact structures SC. Specifically, the storage node contact structure SC in the memory cell UC may be disposed close to one end in the first direction D1 (for example, as shown in FIG. 1, a part of the storage node contact structures SC are disposed at the left sides of the memory cells UC, and another part of the storage node contact structures SC are disposed at the right sides of the memory cells UC) because the storage node contact structure SC in each of the memory cell UC has to be disposed corresponding to the active area AA, and the relatively wider second pitch P2 is required for cooperating with the allocation design of the storage node contact structures SC. For example, in some embodiments, the line width of each of the word lines WL may be substantially equal to the line width of each of the bit lines BL, the spacing between two adjacent word lines WL in the second direction D2 may be substantially equal to the line width of each of the word lines WL in the second direction D2, and the spacing between two adjacent bit lines BL in the first direction D1 may be substantially equal to twice the line width of each of the bit lines BL in the first direction D1. Under the condition described above, the second pitch P2 may be substantially equal to 1.5 times the first pitch P1.

It is worth noting that, compared with the condition that the elongation direction of the word line WL is perpendicular to the elongation direction of the bit line BL, and the word lines WL and the bit lines BL are arranged by the first pitch P1 and the second pitch P2 described above respectively, the memory cell UC of this embodiment may have a relatively smaller area because the word lines WL or the bit lines BL are disposed obliquely, and the purpose of enhancing the density of the memory cells UC may be achieved by reducing the area of the memory cell UC. For example, the area of the memory cell UC with the included angle between the first direction D1 and the second direction D2 being about 45 degrees may be equal to 70% of the area of the memory cell UC with the first direction D1 perpendicular to the second direction D2. Additionally, because of the consideration about the allocation of the storage node contact structures SC, the included angle between the first direction D1 and the second direction D2 has to be larger than a specific angle for avoiding being unable to provide the required space for forming the corresponding storage node contact structures SC. For example, in some embodiments, the included angle between the first direction D1 and the second direction D2 may be larger than or equal to 45 degrees, but not limited thereto.

In addition, the elongation direction of each of the active areas AA is not parallel to the elongation direction of the word lines WL and not parallel to the elongation direction of the bit lines BL preferably. Accordingly, the active area AA may cross two corresponding word lines WL, and there may be space at two opposite ends of the active area AA in the elongation direction of the active area AA for forming the storage node contact structures SC. For example, each of the active areas AA may be elongated in a third direction D3. The third direction D3 is not parallel to the first direction D1, and the third direction D3 is not parallel to the second direction D2. In some embodiments, an included angle between the third direction D3 and the first direction D1 (such as a second included angle A2 shown in FIG. 2) may range from 67 degrees to 112 degrees, and an included angle between the third direction D3 and the second direction D2 (such as a third included angle A3 shown in FIG. 2) may range from 15 degrees to 70 degrees, but not limited thereto. For instance, when the first included angle A1 between the first direction D1 and the second direction D2 is 45 degrees, the second included angle A2 may be about 67 degrees, and the third included angle A3 may be about 22 degrees. Additionally, the first direction D1, the second direction D2, and the third direction D3 described above may be perpendicular to a thickness direction of the semiconductor substrate 10 (i.e. the fourth direction D4) respectively, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 3:
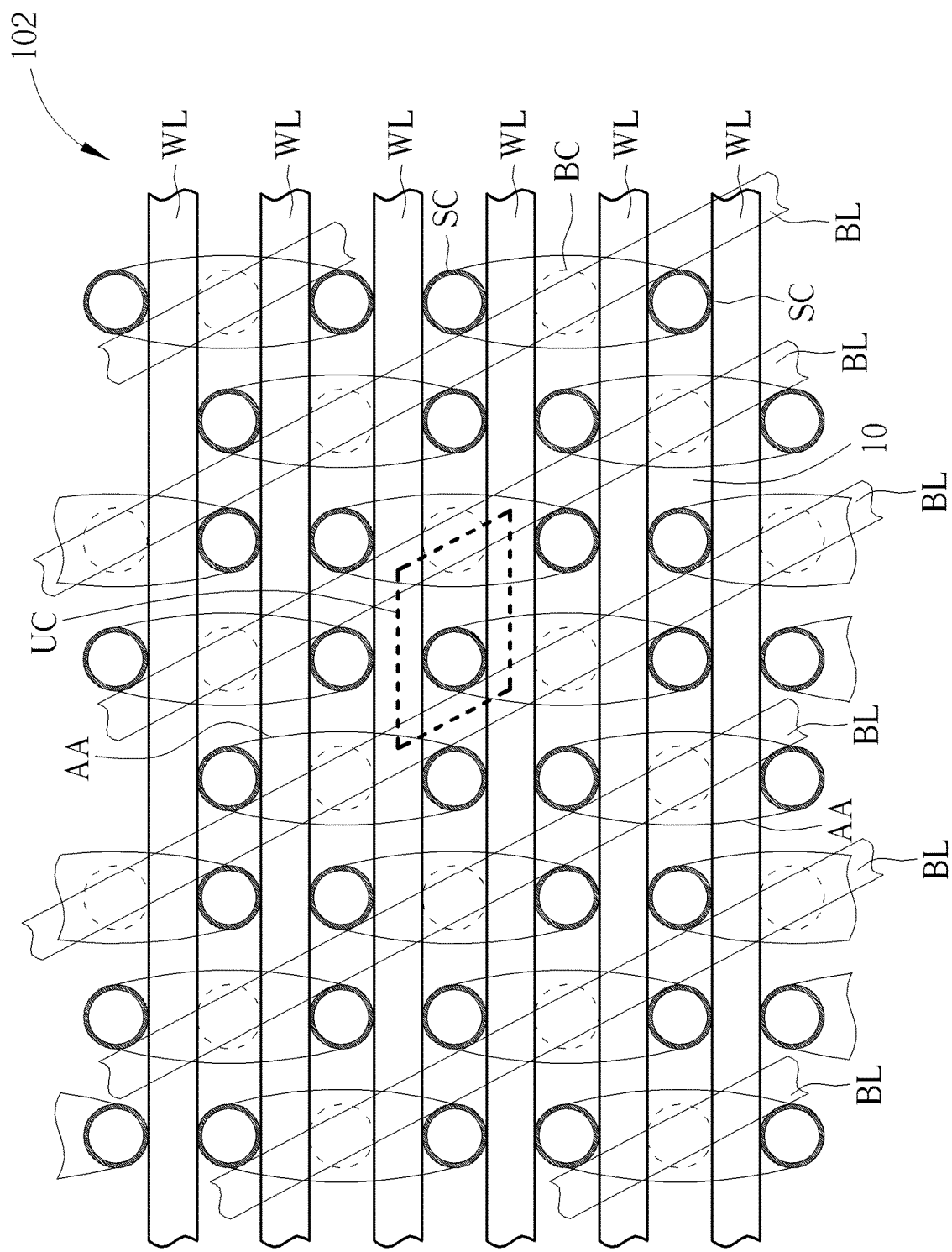
FIG. 3 is a schematic drawing illustrating a semiconductor memory device according to a second embodiment of the present invention.
Figure 4:
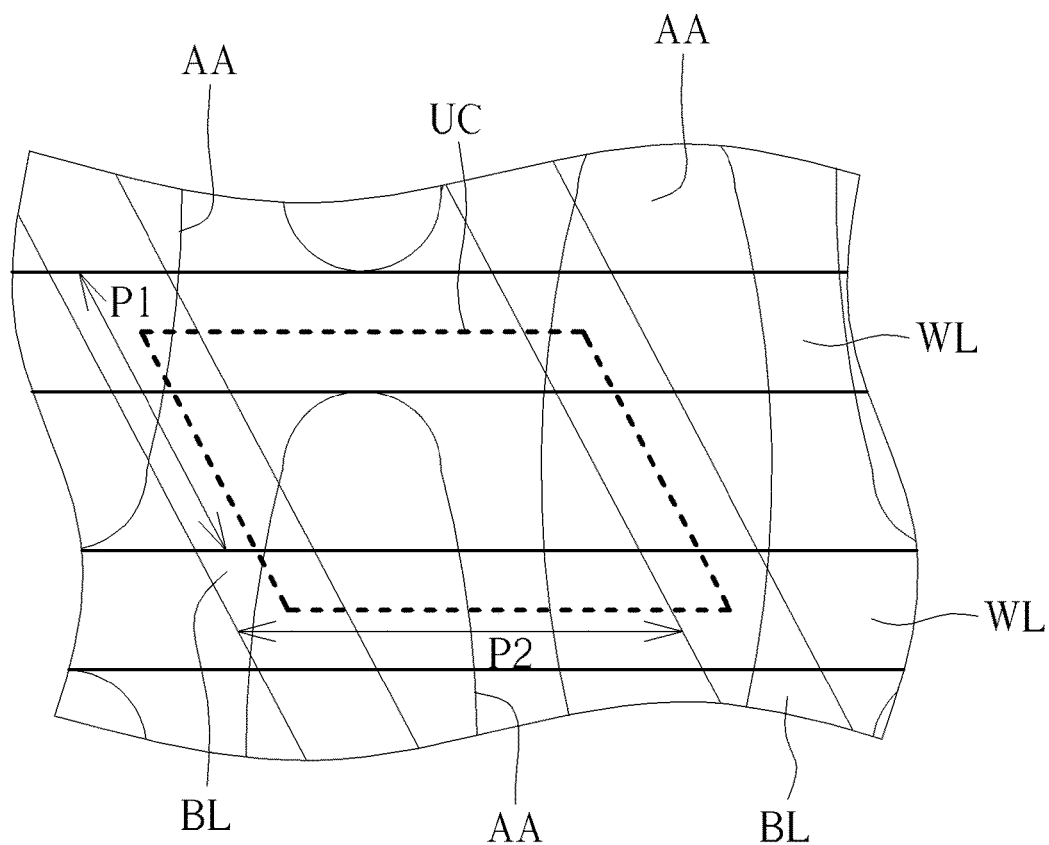
FIG. 4 is an enlarged view of a memory cell in the semiconductor memory device according to the second embodiment of the present invention.
Figure 4:
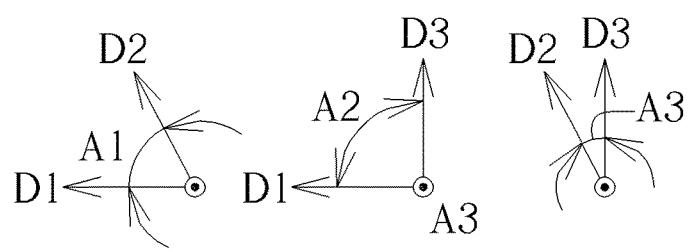

FIG. 3 is a schematic drawing illustrating a semiconductor memory device 102 according to a second embodiment of the present invention, and FIG. 4 is an enlarged view of the memory cell UC in the semiconductor memory device 102 of this embodiment. As shown in FIG. 3 and FIG. 4, the difference between the semiconductor memory device 102 in this embodiment and the semiconductor memory device in the first embodiment mentioned above is that the included angle between the first direction D1 and the second direction D2 in this embodiment may be larger than or equal to 60 degrees, and relatively larger storage node contact structures SC may be formed in the corresponding memory cell UC accordingly, but not limited thereto. Additionally, compared with the condition that the elongation direction of the word line WL is perpendicular to the elongation direction of the bit line BL, and the word lines WL and the bit lines BL are arranged by the first pitch P1 and the second pitch P2 described above respectively, the memory cell UC of this embodiment may still have a relatively smaller area because the word lines WL or the bit lines BL are disposed obliquely, and the purpose of enhancing the density of the memory cells UC may be still achieved. For example, the area of the memory cell UC with the included angle between the first direction D1 and the second direction D2 being about 60 degrees may be equal to about 85% of the area of the memory cell UC with the first direction D1 perpendicular to the second direction D2.

Figure 5:
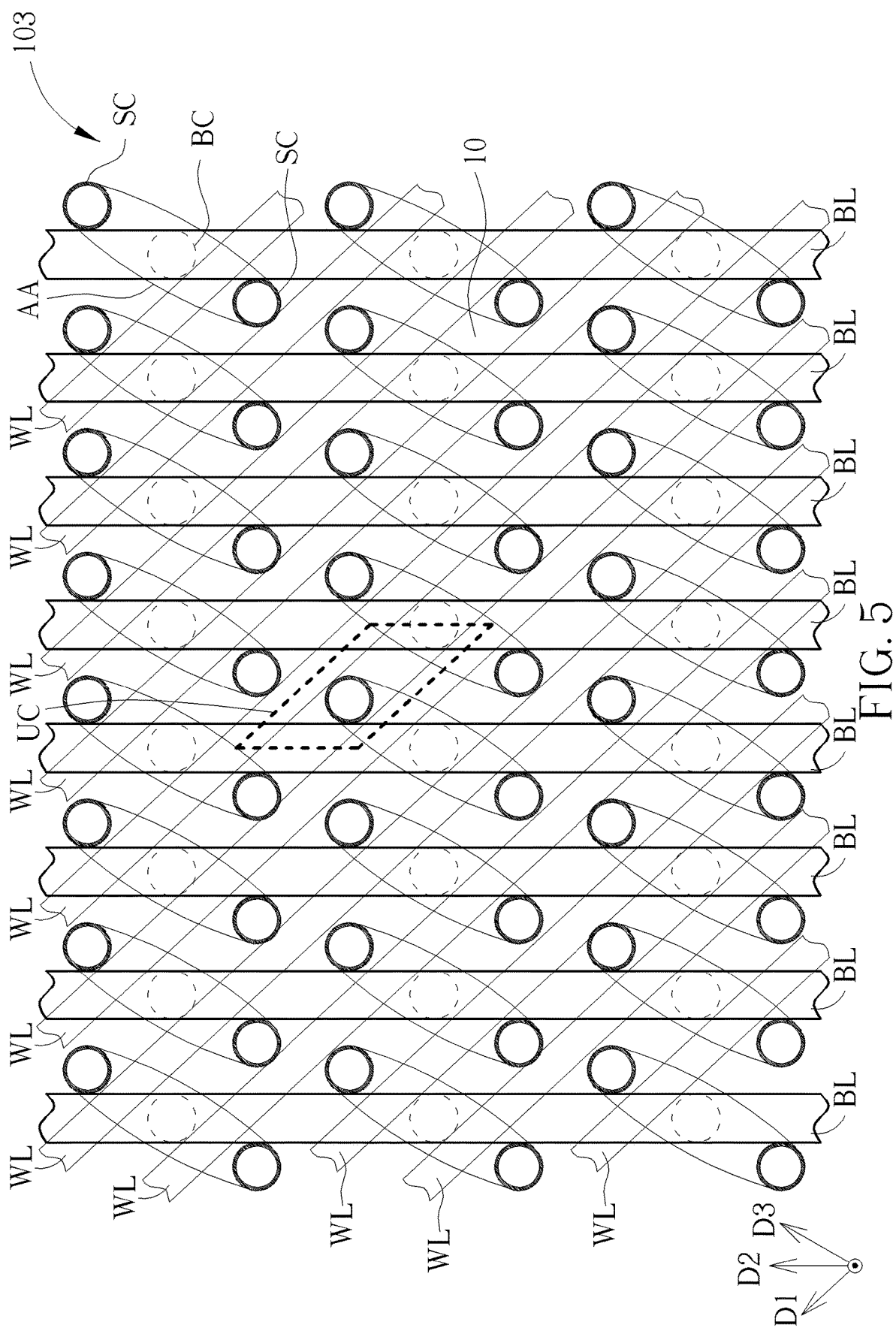
FIG. 5 is a schematic drawing illustrating a semiconductor memory device according to a third embodiment of the present invention.
Figure 6:
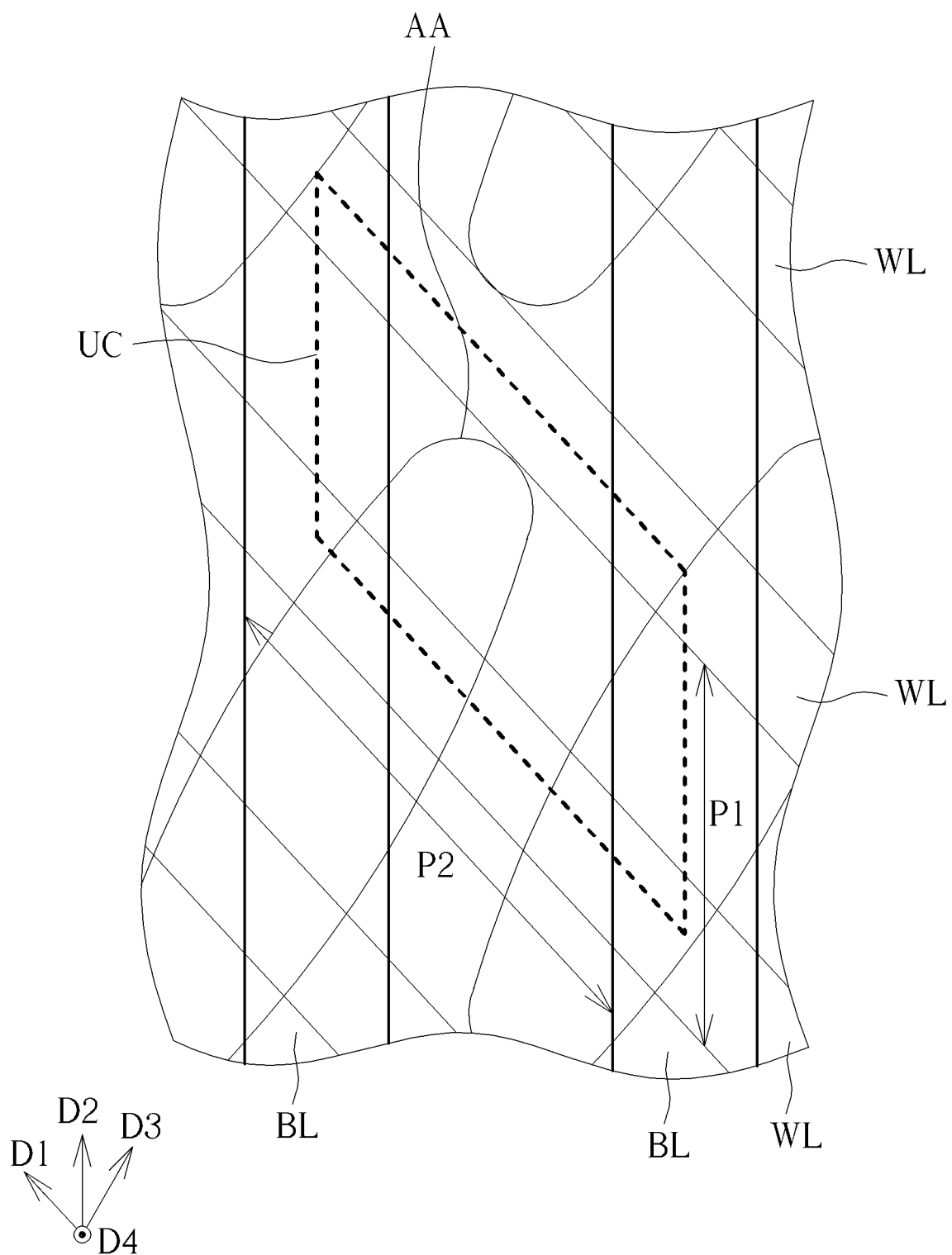
FIG. 6 is an enlarged view of a memory cell in the semiconductor memory device according to the third embodiment of the present invention.

FIG. 5 is a schematic drawing illustrating a semiconductor memory device 103 according to a third embodiment of the present invention, and FIG. 6 is an enlarged view of the memory cell UC in the semiconductor memory device 103 of this embodiment. As shown in FIG. 5 and FIG. 6, the difference between the semiconductor memory device 103 in this embodiment and the semiconductor memory device in the first embodiment mentioned above is that the semiconductor memory device 103 in this embodiment may be regarded as a result of modifying the elongation direction of the word lines WL under the condition that the elongation direction of the bit lines BL is fixed for making the included angle between the elongation direction of the word lines WL (i.e. the first direction D1) and the elongation direction of the bit lines BL (i.e. the second direction D2) being about 45 degrees. Comparatively, the first embodiment described above may be regarded as a result of modifying the elongation direction of the bit lines BL under the condition that the elongation direction of the word lines WL is fixed for making the included angle between the elongation direction of the word lines WL (i.e. the first direction D1) and the elongation direction of the bit lines BL (i.e. the second direction D2) being about 45 degrees.

Figure 7:
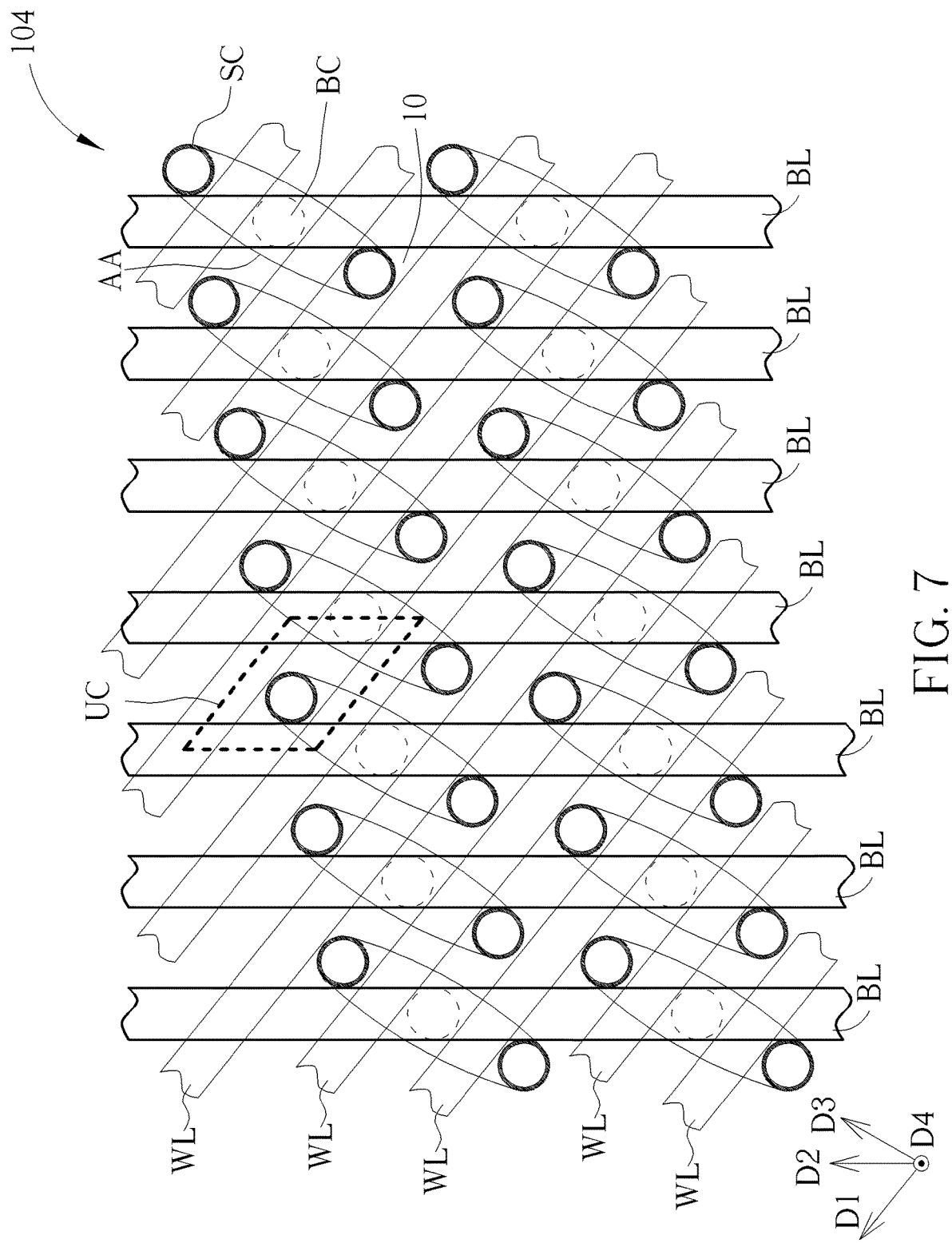
FIG. 7 is a schematic drawing illustrating a semiconductor memory device according to a fourth embodiment of the present invention.
Figure 8:
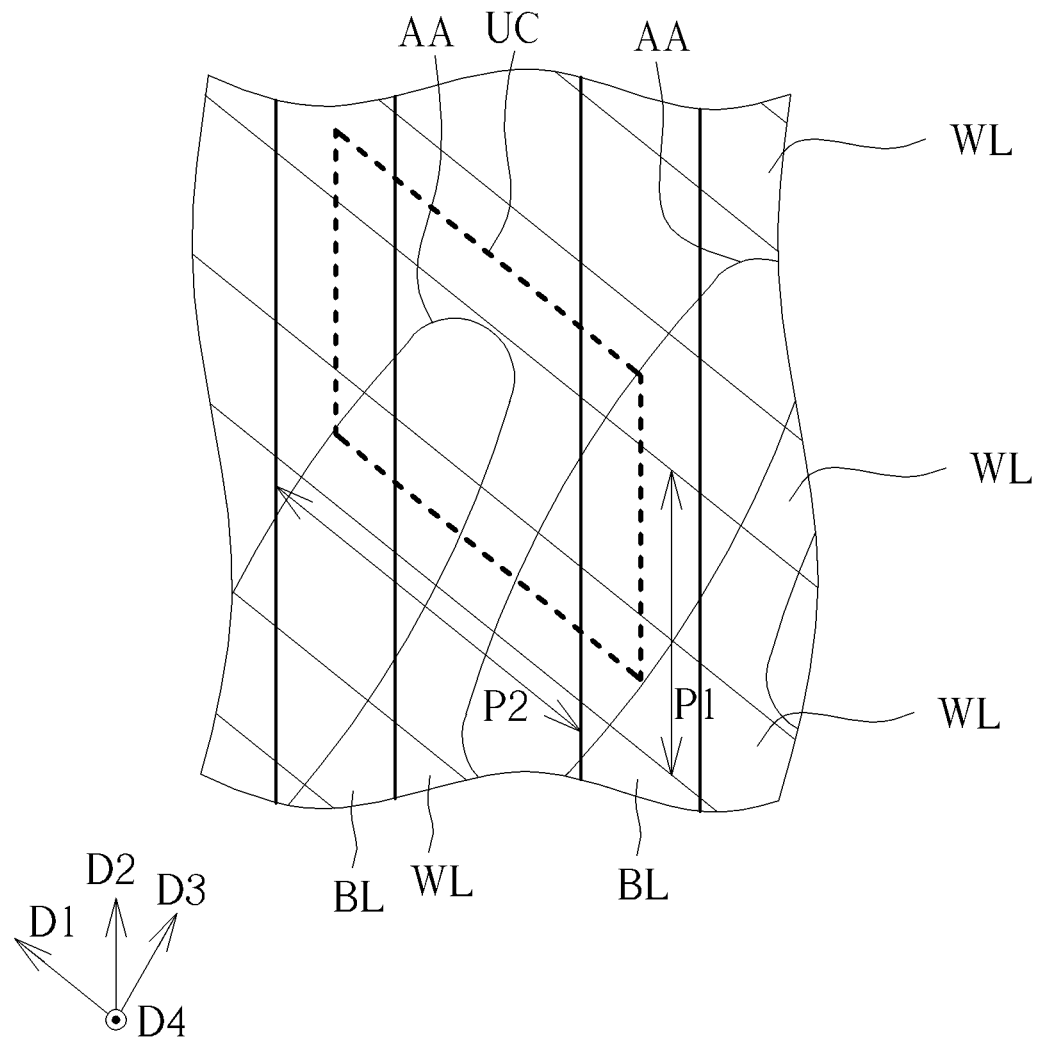
FIG. 8 is an enlarged view of a memory cell in the semiconductor memory device according to the fourth embodiment of the present invention.

FIG. 7 is a schematic drawing illustrating a semiconductor memory device 104 according to a fourth embodiment of the present invention, and FIG. 8 is an enlarged view of the memory cell UC in the semiconductor memory device 104 of this embodiment. As shown in FIG. 7 and FIG. 8, the difference between the semiconductor memory device 104 in this embodiment and the semiconductor memory device in the second embodiment mentioned above is that the semiconductor memory device 104 in this embodiment may be regarded as a result of modifying the elongation direction of the word lines WL under the condition that the elongation direction of the bit lines BL is fixed for making the included angle between the elongation direction of the word lines WL (i.e. the first direction D1) and the elongation direction of the bit lines BL (i.e. the second direction D2) being about 60 degrees. Comparatively, the second embodiment described above may be regarded as a result of modifying the elongation direction of the bit lines BL under the condition that the elongation direction of the word lines WL is fixed for making the included angle between the elongation direction of the word lines WL (i.e. the first direction D1) and the elongation direction of the bit lines BL (i.e. the second direction D2) being about 60 degrees.

To summarize the above descriptions, in the semiconductor memory device of the present invention, the word lines or the bit lines may be disposed obliquely for making the included angle between the elongation direction of the word lines (i.e. the first direction) and the elongation direction of the bit lines (i.e. the second direction) larger than 0 degree and smaller than 90 degrees. The size of the memory cell defined by the word lines and the bit lines crossing one another may be reduced, and the memory cell density may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a semiconductor substrate comprising active areas;
word lines disposed parallel to one another, and each of the word lines being elongated in a first direction, wherein each of the word lines overlaps at least one of the active areas; and
bit lines disposed parallel to one another, and each of the bit lines being elongated in a second direction, wherein each of the bit lines overlaps at least one of the active areas, the bit lines cross the word lines, and an included angle between the first direction and the second direction is larger than 0 degree and smaller than 90 degrees, wherein each of the active areas is elongated in a third direction, and the third direction is not perpendicular to the first direction and the second direction, wherein an included angle between the third direction and the first direction is smaller than 90 degrees and is larger than the included angle between the first direction and the second direction.

2. The semiconductor memory device according to claim 1, wherein the included angle between the first direction and the second direction is larger than or equal to 45 degrees.

3. The semiconductor memory device according to claim 1, wherein the included angle between the first direction and the second direction is larger than or equal to 60 degrees.

4. The semiconductor memory device according to claim 1, wherein the third direction is not parallel to the first direction, and the third direction is not parallel to the second direction.

5. The semiconductor memory device according to claim 4, wherein an included angle between the third direction and the second direction ranges from 15 degrees to 70 degrees.

6. The semiconductor memory device according to claim 1, wherein the word lines have a first pitch in the second direction, the bit lines have a second pitch in the first direction, and the second pitch is larger than the first pitch.

7. The semiconductor memory device according to claim 6, wherein the second pitch is equal to 1.5 times the first pitch.

8. The semiconductor memory device according to claim 1, wherein each of the active areas is disposed corresponding to two of the word lines.

9. The semiconductor memory device according to claim 8, wherein each of the active areas is disposed corresponding to one of the bit lines.

* * * * *